United States Patent [19]

Marzin et al.

[11] 4,006,365
[45] Feb. 1, 1977

[54] EXCLUSIVE OR INTEGRATED LOGIC CIRCUITS USING COMPLEMENTARY MOSFET TECHNOLOGY

[75] Inventors: Claude Raymond Marzin, Fishkill, N.Y.; Claude Maurice Rougeaux, Paris; Patrice Jean Claude Vernes, Mennecy, both of France

[73] Assignee: International Business Machines Corporation, Armonk, N.Y.

[22] Filed: Nov. 26, 1975

[21] Appl. No.: 635,487

[52] U.S. Cl. .............................. 307/205; 307/213; 307/214; 307/216
[51] Int. Cl.² ....................................... H03K 19/08
[58] Field of Search ........... 307/205, 213, 214, 216

[56] References Cited

UNITED STATES PATENTS

| | | | |
|---|---|---|---|
| 3,252,011 | 5/1966 | Zuk | 307/216 X |
| 3,668,425 | 6/1972 | Schmidt, Jr. | 307/216 |

*Primary Examiner*—John S. Heyman
*Assistant Examiner*—Larry N. Anagnos
*Attorney, Agent, or Firm*—J. C. Redmond, Jr.

[57] ABSTRACT

An Exclusive OR circuit fabricated in CMOS technology is arranged to (1) minimize circuit switching elements and (2) generate inverted inputs within the circuit.

8 Claims, 6 Drawing Figures

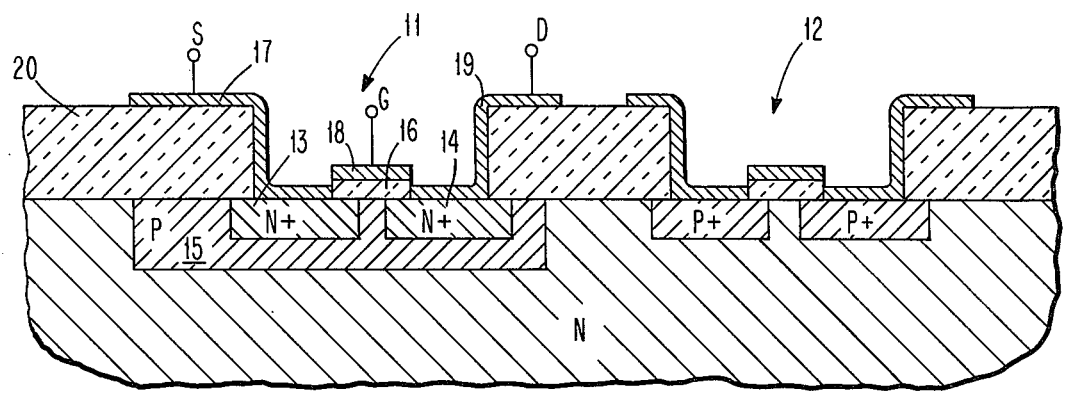
FIG. 1
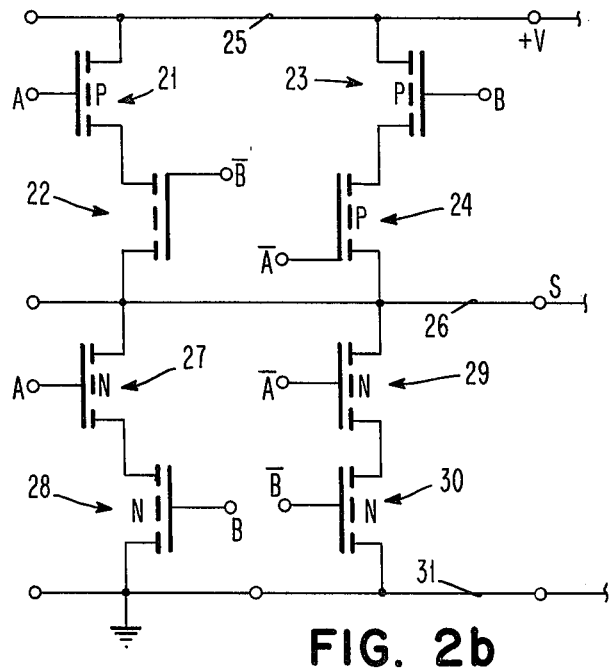
FIG. 2a
FIG. 2b
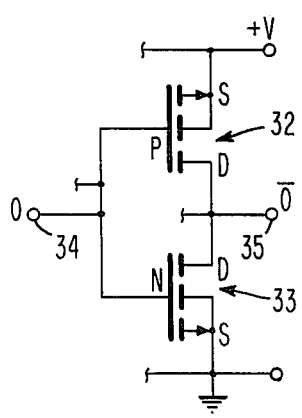
FIG. 2c
FIG. 2d

EXCLUSIVE OR INTEGRATED LOGIC CIRCUITS USING COMPLEMENTARY MOSFET TECHNOLOGY

BACKGROUND OF THE INVENTION

A. Field of the Invention

This invention concerns integrated logic circuits. More particularly, the invention concerns improved Exclusive OR circuit making use of complementary metal oxide semiconductor (CMOS) field effect transistor (FET) technology.

B. Description of the Prior Art

Logic circuits making use of CMOS technology are well known and are currently used in a large number of applications. An Exclusive OR circuit produces a logic zero output when two inputs are brought to the same logic level and produces a logic "1" output when the inputs are brought to different levels. Prior art Exclusive OR circuits in CMOS technology are comprised of 12, or more, devices. A portion of the devices are required to generate the complement signal from the input or true signals. The remaining devices are employed to process the true and complement signals to obtain the Exclusive OR output signal. Exclusive OR circuits having a reduced number of switching elements will permit additional logical functions to be incorporated in a semiconductor chip thereby increasing the logical power of the chip.

An object of the invention is to provide an Exclusive OR integrated circuit fabricated in CMOS technology and having a minimum number of switching elements.

Another object of the invention is an Exclusive OR integrated circuit fabricated in CMOS technology and having a symmetrical topological arrangement.

SUMMARY OF THE INVENTION

In an illustrative embodiment, first, second, third, and fourth sets of series connected MOSFET devices are connected as legs in a conventional bridge circuit coupled at opposite ends between a supply voltage, typically +V and a reference potential, typically ground. The first and third sets of series connected MOSFET devices comprise the upper legs of the bridge circuit and are of the same conductivity type, typically P-channel devices. The second and fourth sets of series connected MOSFET devices comprise the lower legs of the bridge circuit and are of the same conductivity type but opposite conductivity type to the upper legs or N-channel devices. Each side of the bridge circuit comprises series connected upper and lower legs of opposite conductivity type MOSFET devices. The bridge circuit also includes fifth and sixth legs, each leg including a MOSFET device having a conductivity type corresponding to that for the lower legs. The fifth leg is coupled at one end to (a) mid-point of the first leg, (b) the gate electrode of the lower MOSFET in the third leg, and (c) to the gate electrode of the upper MOSFET device in the fourth leg. The other end of the fifth leg is connected to the reference potential. The sixth leg is connected at one end to (a) the gate electrode of the lower MOSFET device in the first leg, (b) the midpoint of the third leg, and (c) the gate electrode of the lower MOSFET device in the fourth leg. The other end of the sixth leg is connected to the reference potential. Input signals A and B are supplied to the bridge circuit. The A signal is coupled to the gate electrode of the MOSFET device in the fifth leg. The B input signal is coupled to the gate electrodes of the upper MOSFET device in the third leg and the lower MOSFET device in the second leg. The B input signal is also supplied to the gate electrode of the MOSFET device in the sixth leg. the mid-points at each side of the bridge circuit are connected together and to an output or summing (S) circuit.

In operation, one set of like input signals cause the output circuit to be connected to the reference potential through one lower leg of the bridge circuit. The other set of like input signals cause the output circuit to be connected to the reference potential through the other lower leg. One set of unlike input signals cause the output circuit to be connected to the supply potential through one upper leg. The other set of unlike signals causes the output circuit to be connected to the supply voltage through the other upper leg. Summarizing, like input signals produce one binary output signal and unlike input signals produce the other binary output signal which defines the well known Exclusive OR function.

One feature of the inverter is an Exclusive OR circuit fabricated in CMOS technology that generates internally inverted or complemented input signals required for the function.

Another feature of the invention is utilizing MOSFET devices for generating a miniterm to co-act with another MOSFET device to internally generate complements of the input signal for use in the Exclusive OR function.

BRIEF DESCRIPTION OF THE DRAWING

These and other features of the invention will be more fully understood from the following detailed specification taken in conjunction with the appended drawing in which:

FIG. 1 is a schematic side view of a semiconductor structure formed of a complementary pair of MOSFET devices.

FIG. 2a is a truth table for the Exclusive OR function.

FIG. 2b is an electrical schematic of a prior art Exclusive OR circuit.

FIG. 2c is an electrical schematic of a prior art CMOS inverter circuit.

FIG. 2d is a truth table for the circuit of FIG. 2c.

DESCRIPTION OF PREFERRED EMBODIMENT

Figure 3:
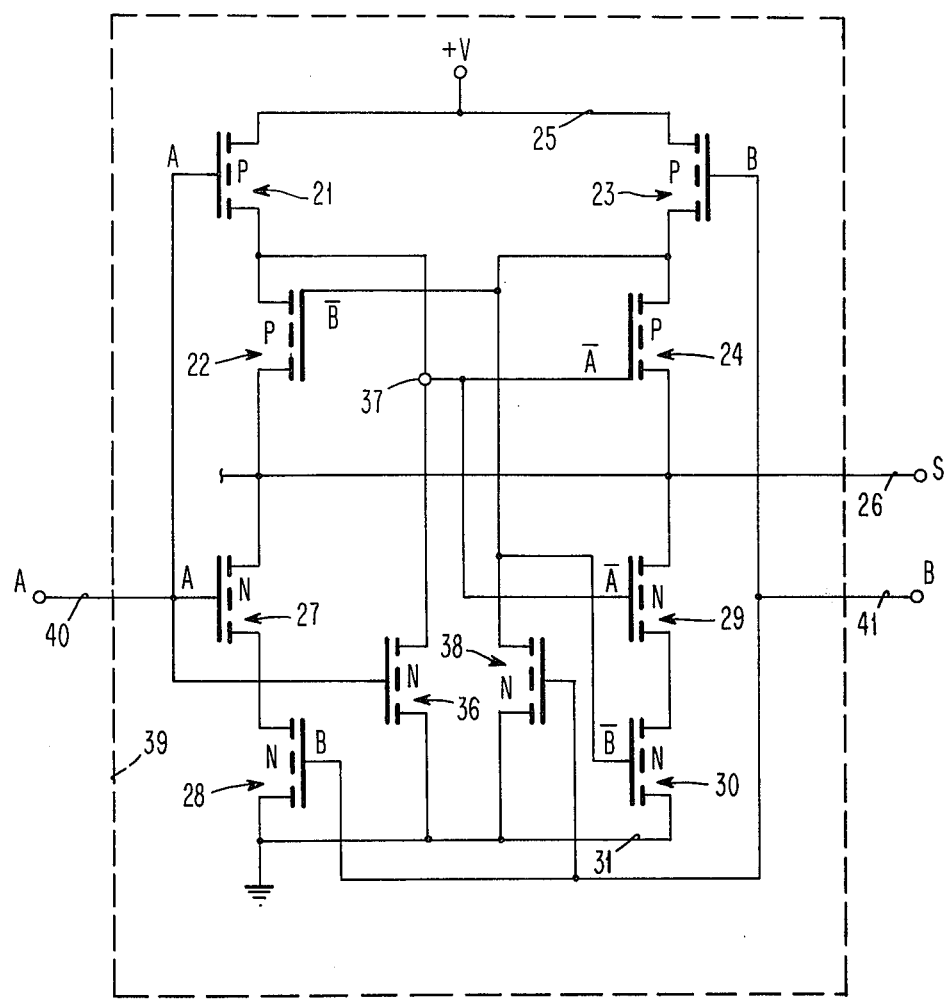
FIG. 3 is an Exclusive OR circuit practicing the principles of the present invention.

FIG. 1 comprises a complementary pair of metal oxide semiconductor field effect (MOSFET) type transistors. The different types of MOSFET devices as well as their operation are well known in the art, so the description thereof will be very brief. A MOSFET device is a semiconductor device which includes two areas spaced from each other and of a first type of conductivity, which are the so called source and drain areas and which are placed upon a substrate with a type of conductivity opposite to the first one. The surface portion of the substrate within the source and drain areas, is the so called channel area. An insulator, generally, a thin coating of silicon dioxide ($SiO_2$) is thermally grown upon the channel and is provided with a metal electrode which is the so called gate electrode. Other two electrodes are formed, which are in contact with the source and drain areas, respectively. Structure 10, shown in FIG. 1, is comprised of two complementary MOSFET devices 11 and 12. A first N-channel MOS- FET device includes two source and drain areas N+13, 14 formed by diffusion in the P type area 15, a thin insulating layer 16, contact metal electrodes 17, 18 and 19 which are respectively the source, the gate and the drain. It should be noted that the rest of the MOSFET is protected with a thick insulating layer 20. When the gate of said device is brought to a positive potential, a negative electron charge is induced very near the insulating P type interface 15, due to a capacitive effect through the thin insulating layer which, therefore, is enhanced with N type carriers; this negative charge changes the surface portion of said P type area into an N type area which entails conduction between the N+type source and drain areas. This conductive area is the so called channel.

Structure 10 includes also a P-channel MOSFET 12 which is substantially identical with device 11 but its N type substrate is also the substrate of the integrated circuit chip. When the gate is brought to a negative potential, a positive electron charge (holes) is induced into the channel area, which, in like manner, entails conduction between the source and drain areas.

The interest of the complementary MOSFET technology resides essentially in specific advantages which are due to integration. For instance, it is a well known fact that the power dissipated through the conventional unipolar or bipolar transistorized circuits is mostly comprised of the power consumed in steady state, since, in general, the transistors loads are resistors and that in a complementary MOSFET divice, the resistive load is replaced by a transistor of a complementary polarity, which entails an important reduction of the consumed power. From amongst other advantages, this technology offers a high reliability, a high noise immunity and high speed operations. In spite of a few drawbacks, namely, additional manufacturing steps are required in the process and the interconnection of the network is relatively complex, the logic circuits, according to the complementary MOSFET technology, appear very attractive in the future.

FIG. 2b shows an Exclusive OR logic circuit according to the complementary MOSFET technology found in the prior art. Though the Exclusive OR Logic function is well known, the corresponding truth table is shown in details in FIG. 2a. The circuit in relation to this truth table (FIG. 2b) is comprised of complementary, P-channel, N-channel, enhancement type MOSFET devices, the P-channel type MOSFET devices making it possible to obtain the miniterms given by $S$, i.e., $S = \overline{A} B + A \overline{B}$ whereas the second N-channel type MOSFET devices making it possible to obtain the complement, i.e., $\overline{S} = A B + \overline{A} \overline{B}$. The P-channel MOSFET's, namely 21, 22 (for the miniterm A $\overline{B}$) and 23, 24 (for the miniterm $\overline{A}$ B) are respectively series biased between the most positive source, here +V, at terminal 25 and the output connection 26. Each of these P-channel devices has its N type substrate brought to the most positive potential (in that case, +V).

Symmetrically, the N-channel MOSFET devices, namely 27, 28 (for the miniterm A B) and 29, 30 (for the miniterm $\overline{A}$ $\overline{B}$) are respectively series biased between the most negative voltage source (in that case, ground 31) and the output connection 26 which produces the results. Each of these N-channel devices (areas 15 for the structure 10 shown in FIG. 1) has its substrate brought to the most negative potential (in that case, ground.

The Exclusive OR circuit shown in FIG. 2b cannot be simplified. It should be noted that, in order to obtain the required Exclusive OR function, it is necessary to have not only logic inputs A and B but also inputs $\overline{A}$ and $\overline{B}$. The latter, therefore, must be produced independently, for instance, by making use of two inverter circuits, of the type shown in FIG. 2c. This well known inverter includes two complementary P and N-channel MOSFET's 32, 33 respectively, series connected between +V and ground; this circuit causes logic output 0 at terminal 35 to correspond to logic input 0 at terminal 34. The truth table of this circuit is shown in FIG. 2d. The operation can be briefly explained as follows: when a logic 1 is applied to input terminal 34, (which, for instance, corresponds to potential +V), the N-channel MOSFET 33 is made conducting while P-channel MOSFET 32 is non-conducting. Therefore, the output is brought to the lowest potential, here, ground, i.e., to logic zero through MOSFET 33. In a symmetrical manner, when a low level (ground) i.e., logic zero, is applied to the input, the high level, i.e., potential +V, is brought back to the output terminal, through MOSFET 32 made conducting while MOSFET 33 is non-conducting. The implementation of two inverters of such a type would bring the number of the necessary basic devices, to 12. It is a well known fact that the reduction of the number of the devices necessary to obtain a determined logic function, is of high interest since the so obtained reduction of space makes it possible to have chips with higher densities.

FIG. 3 is an example of the Exclusive OR circuit according to the principles of this invention. The basic Exclusive OR structure of FIG. 2b is maintained, and, therefore, the same elements have the same references. Thus, between +V (terminal 25) and the output connection 26, there are still two pairs of P-channel MOSFET's 21, 22 and 23, 24 and between ground (termial 31) and the output connection 26, two pairs of N-channel MOSFET's 27, 28 and 29, 30. The N type substrates are connected to +V whereas the P type substrates are connected to ground as seen previously. The number of the devices is reduced by energizing the inverters which are normally required to produce logic inputs $\overline{A}$ and $\overline{B}$ from pre-existing devices in the basic structure wherein they are normally utilized. For instance, the pair of P-channel MOSFET's 21, 22, which produces miniterm A $\overline{B}$ at the output, will be partially utilized to produce logic input $\overline{A}$. As shown in FIG. 3, an N-channel MOSFET 36 is inverter mounted with P-channel MOSFET 21. The source and drain of MOSFET 36 are connected to ground and to the drain of MOSFET 21, respectively. The two gate electrodes are gathered together and are connected to their logic input A. Node 37, therefore, produces input $\overline{A}$ which is utilized to drive in parallel the gate electrodes of MOSFET's 24 and 29. In a similar manner, another N-channel MOSFET 28 is inverter mounted with MOSFET 23. The two gate electrodes are connected together to input B, and logic input $\overline{B}$ which feeds MOSFET's 22 and 30, is obtained on the line connecting the drains. Thus, an Exclusive OR logic circuit 39 with two inputs A and B designated by 40 and 41, respectively, is obtained which includes 10 basic devices; four P-channel MOSFET's and six N-channel MOSFET's.

In operation, a binary 1 shall be defined as a potential corresponding to +V and a binary zero shall be defined as a potential corresponding to ground. When A and B input signals are binary 1's, all legs of the bridge circuit shown in FIG. 3 are non-conducting except for the second leg comprising devices 27 and 28 and the fifth and sixth legs comprising devices 36 and 38, respectively. The output signal appearing on the line 26 is at ground level indicative of a binary zero since only the second leg or devices 27 and 28 are connected to the line. When A and B input signals are binary zeros, all legs of the bridge circuit are non-conducting except the fourth leg comprising the devices 29 and 30. The signal appearing on the line 26 is at ground level indicative of a binary zero. Thus, like input signals generate the same output or binary zero signal. When the A and B signals are binary 1 and zero, respectively, all legs of the bridge circuit are non-conducting except the third leg comprising the devices 23 and 24 and the fifth leg comprising the device 36. The output signal appearing on line 26 is at +V potential indicative of a binary 1 since the output line is only connected to the third leg. Similarly, when the A and B input signals are binary zero and 1, respectively, all legs of the bridge circuit are non-conducting except the first and sixth legs. The output signal appearing on line 26 is at +V potential indicative of a binary 1 since the line is only connected to the first leg. Thus, unlike binary input signals generate a binary 1 signal which when combined with the binary zero signal for like binary input signals defines the Exclusive OR function.

It should be noted that the so obtained circuit is perfectly symmetrical as to the position of the MOSFET devices which is an advantage for integration in a chip. Besides, it should be remarked that various modifications made in the basic circuit and in conformity with the teaching of this invention, bring about variations. For instance, two P-channel MOSFET's respectively mounted between +V and the drains of MOSFET's 28 and 30, can be added to the basic circuit instead of the additional MOSFET's 36 and 38. Finally, a mixed solution can also be envisaged which consists in maintaining, for instance inverter 21–36 and forming another inverter with one P-channel MOSFET associated with the N-channel MOSFET 30. This last arrangement necessitates five complementary pairs of MOSFET's. The choice between these various facilities can be made while bearing in mind that an N-channel MOSFET is more advantageous from the switching rate point of view (the mobility of the electrons is about three times more than that of the holes) but has a drawback to consume more power in the steady state (in that case, the consumed power is a function of the source-drain leakage current which is more important in the N-channel MOSFET's than in the P-channel MOSFET's). On the other hand, this simplified arrangement which reduces the number of the necessary devices, to 10 is made possible for +V cannot be directly connected to ground. Indeed, should this switching operation be impossible in the basic circuit, the condition $A \bar{B} = 1$ (branch formed of MOSFET's 21, 22) and $\bar{A} B = 1$ (branch formed of MOSFET's 29, 30), for instance, cannot be obtained simultaneously. Also, no short circuit can be created through branches 21, 36 and 23, 38 since, in these inverters, a single device is made conducting while the other one is non-conducting.

While the invention has been particularly shown and described with reference to the preferred embodiments thereof, it will be understood by those skilled in the art that the foregoing and other changes in form and details may be made therein without departing from the spirit and scope of the invention.

What is claimed is:
1. An Exclusive OR circuit comprising
   a. first, second, third, and fourth MOS inverters connected in a bridge circuit,
   b. first and second MOS switching means coupled to the bridge circuit, the first switching means being coupled to the first and second inverters as the first side of the bridge circuit and the second switching means being coupled to the third and fourth inverters as the second side of the bridge circuit,
   c. first and second potential sources connected to different ends of the bridge circuit,
   d. means forming a gate discharge path from one side of the bridge circuit through an inverter of the other side of the bridge circuit to the output circuit,
   e. a first input signal coupled to the first and second inverters and to the first switching means,
   f. a second input signal coupled to the second and third inverters and to the second switching means, and
   g. an output circuit coupled to the bridge circuit, a first set of like first and second input signals operating the second inverter and a second set of like first and second input signals operating the fourth inverter to connect the first potential source to the output circuit and a first set of unlike first and second input signals operating the first inverter and a second set of unlike first and second input signals operating the third inverter to connect the second potential source to the output circuit thereby providing potentials definitive of the Exclusive OR function from the combination of first and second input signals.

2. The Exclusive OR circuit defined in claim 1 wherein the first and third are of one conductivity type and the second and fourth inverters are of the opposite conductivity type.

3. The Exclusive OR circuit of claim 2 wherein the first and second switching means coupled to the bridge circuit include means for generating the complements of the first and second input signals.

4. The Exclusive OR circuit of claim 3 wherein the MOSFET devices in the firs and second switching means coupled to the bridge circuit having a conductivity type corresponding to the MOSFET devices included in the second and fourth inverters of the bridge circuit.

5. The Exclusive OR circuit of claim 4 wherein the input signals and the first and second switching means are coupled to the inverters of the bridge circuit to define the miniterms of the Exclusive OR function.

6. The Exclusive OR circuit of claim 2 wherein the first and second switching means are further coupled to a gate electrode of the third and fourth inverters and to a gate electrode of the first inverter, respectively.

7. The Exclusive OR circuit of claim 1 wherein an inverter in one side of the bridge circuit is in the charging path to the output circuit and is also in the gate discharge path for the inverters in the other side of the bridge circuit.

8. An Exclusive OR circuit comprising
   a. a first set of MOS inverters including a first and a third inverter, of a first conductivity type connected in parallel between a first potential source and an output circuit, b. a second set of MOS inverters including a second and a fourth inverter, of a second conductivity type connected in parallel between a second source of potential and the output circuit,
c. first circuit means including a first MOS switching device of the second conductivity type coupled among the second potential source and the first, third, and fourth MOS inverters,
d. second circuit means including a second MOS switching device of the second conductivity type connected among the second potential source and the first, third and fourth inverters,
e. a first input circuit coupled to the first and second MOS inverters and the first MOS switching device,
f. a second input circuit connected to the second and third MOS inverters and the second MOS switching means, whereby a first set of like first and second input signals operate the second inverter and a second set of like first and second input signals operate the fourth inverter to connect the second potential source to the output circuit and a first set of unlike first and second input signals operate the first inverter and a second set of unlike first and second input signals operate the third inverter to connect the first potential source to the output circuit thereby to provide output potentials definitive of the Exclusive OR function from the combination of first and second input signals.

* * * * *